(12) United States Patent
Pinson, II et al.

(10) Patent No.: US 6,887,124 B2
(45) Date of Patent: May 3, 2005

(54) METHOD OF POLISHING AND CLEANING SUBSTRATES

(75) Inventors: Jay D. Pinson, II, San Jose, CA (US); Arulkumar Shanmugasundram, Milpitas, CA (US)

(73) Assignee: Applied Materials, Inc., Santa Clara, CA (US)

( * ) Notice: Subject to any disclaimer, the term of this patent is extended or adjusted under 35 U.S.C. 154(b) by 87 days.

(21) Appl. No.: 10/153,464

(22) Filed: May 21, 2002

(65) Prior Publication Data

US 2002/0164929 A1 Nov. 7, 2002

Related U.S. Application Data

(62) Division of application No. 09/543,858, filed on Apr. 5, 2000, now Pat. No. 6,413,145.

(51) Int. Cl.[7] .......................... B24B 1/00; B24B 49/00; B24B 51/00
(52) U.S. Cl. .................. 451/5; 451/8; 451/41; 451/54; 451/59; 451/67; 451/339
(58) Field of Search .................. 451/6, 8, 41, 57, 451/59, 54, 63, 65, 67, 285, 286, 287, 288, 289, 290, 5, 55, 331, 332, 333, 339

(56) References Cited

U.S. PATENT DOCUMENTS

| | | | |
|---|---|---|---|
| 2,233,544 A | 3/1941 | McKinley | |
| 3,699,672 A | 10/1972 | Sims | |
| 3,974,491 A | 8/1976 | Sipe | |
| 4,120,052 A | 10/1978 | Butler | |
| 4,485,529 A | 12/1984 | Blum | |
| 4,578,769 A | 3/1986 | Frederick | |
| 4,649,552 A | 3/1987 | Yakawa | |
| 4,651,446 A | 3/1987 | Yukawa et al. | |
| 4,745,564 A | 5/1988 | Tennes et al. | |
| 4,771,394 A | 9/1988 | Cavanaugh | |
| 4,814,661 A | 3/1989 | Ratzlaff et al. | |
| 4,817,306 A | 4/1989 | Bayer | |
| 4,823,426 A | 4/1989 | Bragga | |
| 5,033,013 A | 7/1991 | Kato et al. | |
| 5,240,557 A | 8/1993 | Dyer et al. | |
| 5,269,081 A | 12/1993 | Gray | |
| 5,285,586 A | 2/1994 | Goldston et al. | |
| 5,311,679 A | 5/1994 | Birch, Sr. | |
| 5,313,719 A | 5/1994 | Koethe | |

(Continued)

FOREIGN PATENT DOCUMENTS

JP          61-82442      4/1986

*Primary Examiner*—Timothy V. Eley
(74) *Attorney, Agent, or Firm*—Fish & Richardson

(57) ABSTRACT

The substrate processing system has a factory interface module, a chemical mechanical polisher, a cleaner, a particle monitor and a substrate transfer system disposed as an integrated system. The factory interface module may includes a chamber a storage station located in a chamber of the module to hold a plurality of substrates in a substantially horizontal position. The storage station may hold pad break-in wafers for pad preconditioning and/or monitor wafers for defects monitoring. The particle monitor may have a port coupled to the factory interface module.

9 Claims, 3 Drawing Sheets

U.S. PATENT DOCUMENTS

| | | | |
|---|---|---|---|
| 5,323,650 A | 6/1994 | Fullen et al. | |
| 5,343,445 A | 8/1994 | Cherdak | |
| 5,357,696 A | 10/1994 | Gray et al. | |
| 5,361,778 A | 11/1994 | Seitz | |
| 5,437,289 A | 8/1995 | Liverance et al. | |
| 5,485,402 A | 1/1996 | Smith et al. | |
| 5,502,903 A | 4/1996 | Barker | |
| 5,566,477 A | 10/1996 | Mathis et al. | |
| 5,596,821 A | 1/1997 | Solo | |
| 5,636,146 A | 6/1997 | Flentov et al. | |
| 5,664,346 A | 9/1997 | Barker | |
| 5,673,501 A | 10/1997 | Mathews | |
| 5,679,055 A * | 10/1997 | Greene et al. | 451/10 |
| 5,679,060 A | 10/1997 | Leonard et al. | |
| 5,720,200 A | 2/1998 | Anderson et al. | |
| 5,724,265 A | 3/1998 | Hutchings | |
| 5,728,032 A | 3/1998 | Glass | |
| 5,830,045 A * | 11/1998 | Togawa et al. | 451/288 |
| 5,955,667 A | 9/1999 | Fyfe | |
| 6,050,884 A * | 4/2000 | Togawa et al. | 451/67 |
| 6,122,340 A | 9/2000 | Darley et al. | |
| 6,165,050 A * | 12/2000 | Ban et al. | 451/8 |
| 6,227,950 B1 * | 5/2001 | Hempel et al. | 451/66 |
| 6,257,966 B1 | 7/2001 | Ishikawa et al. | |
| 6,267,642 B1 | 7/2001 | Vogtmann et al. | |
| 6,346,037 B1 * | 2/2002 | Inaba et al. | 451/287 |
| 6,357,147 B1 | 3/2002 | Darley et al. | |
| 6,413,145 B1 | 7/2002 | Pinson et al. | |
| 6,613,200 B2 * | 9/2003 | Li et al. | 204/198 |

* cited by examiner

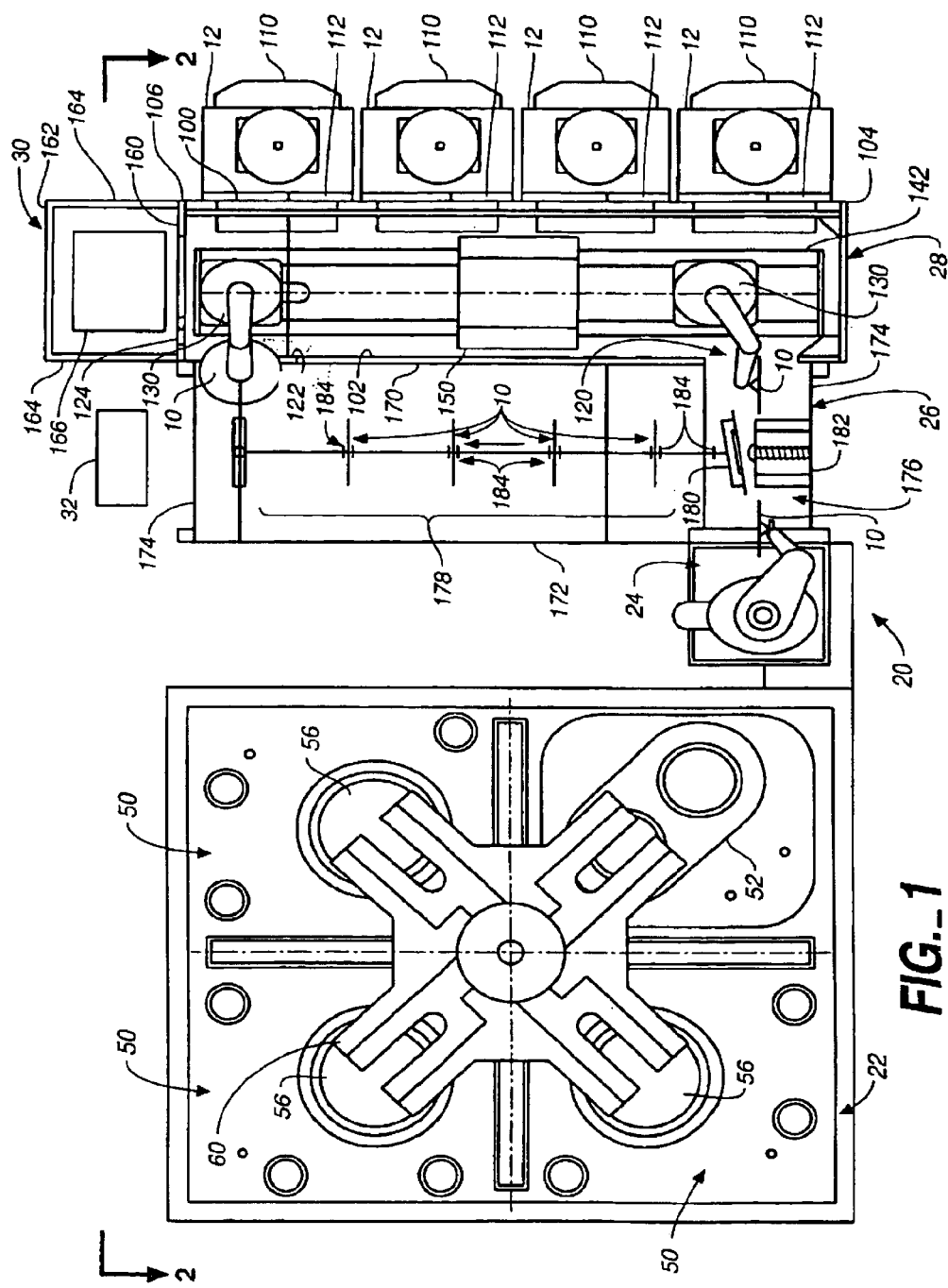
FIG._1

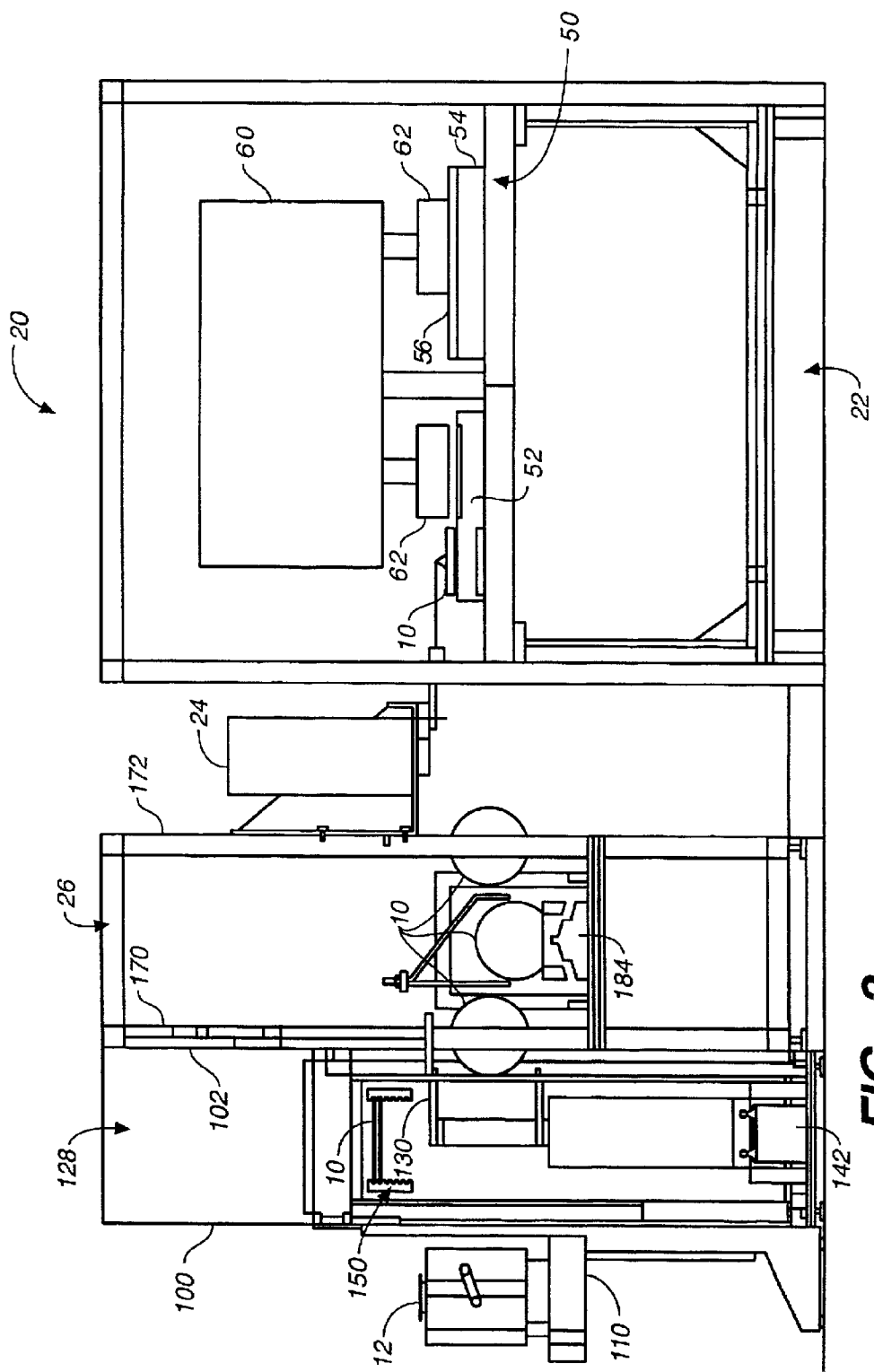
FIG._2

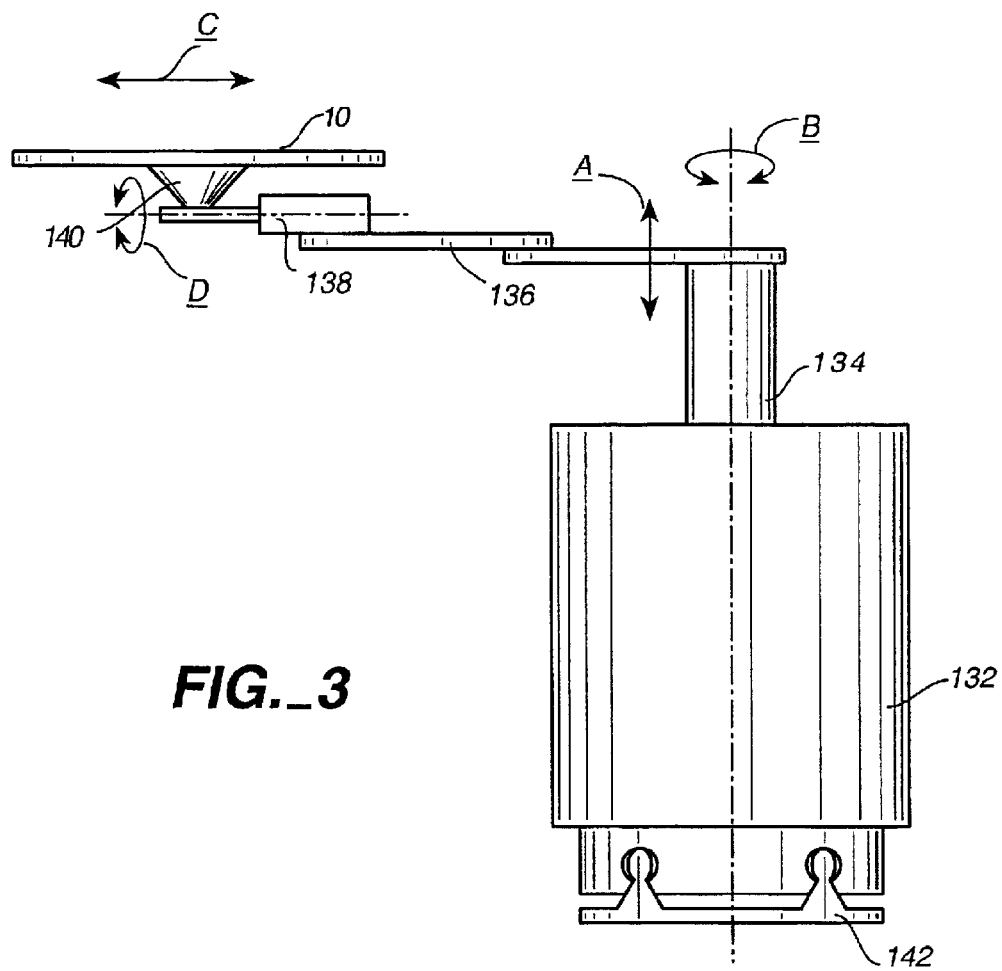
FIG._3
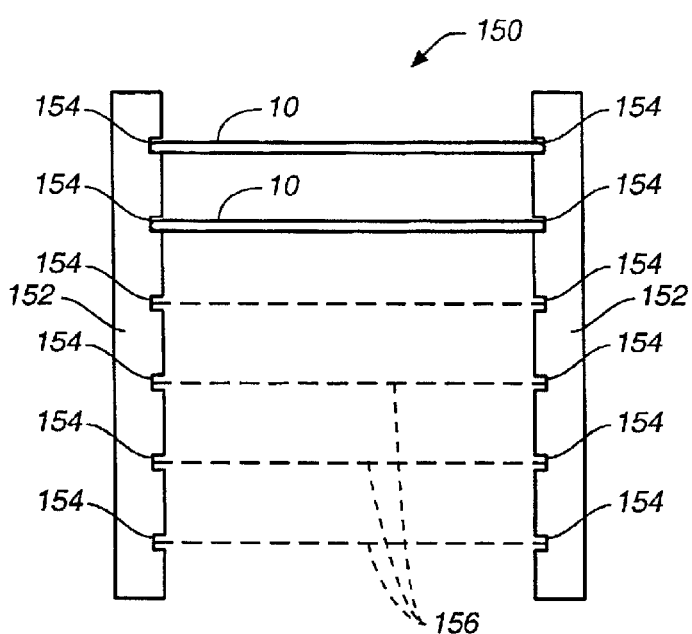
FIG._4

METHOD OF POLISHING AND CLEANING SUBSTRATES

CROSS-REFERENCE TO RELATED APPLICATIONS

This application is a divisional application of and claims priority to U.S. application Ser. No. 09/543,858, filed on Apr. 5, 2000 now U.S. Pat. No. 6,413,145, the entire disclosure of which is incorporated herein by reference.

BACKGROUND

This invention relates to apparatus and methods for chemical mechanical polishing and cleaning a substrate in an integrated system.

An integrated circuit is typically formed on a substrate by the sequential deposition of conductive, semiconductive or insulative layers on a silicon wafer. After each layer is deposited, it is etched to create circuitry features. As a series of layers are sequentially deposited and etched, the outer or uppermost surface of the substrate, i.e., the exposed surface of the substrate, becomes increasingly non-planar. This non-planar surface presents problems in the photolithographic steps of the integrated circuit fabrication process. Therefore, there is a need to periodically planarize the substrate surface.

Chemical mechanical polishing (CMP) is one accepted method of planarization. This planarization method typically requires that the substrate be mounted on a carrier or polishing head. The exposed surface of the substrate is placed against a rotating polishing pad. The polishing pad may be either a "standard" pad or a fixed-abrasive pad. A standard pad has a durable roughened surface, whereas a fixed-abrasive pad has abrasive particles held in a containment media. The carrier head provides a controllable load, i.e., pressure, on the substrate to push it against the polishing pad. A polishing slurry, including at least one chemically-reactive agent, and abrasive particles if a standard pad is used, is supplied to the surface of the polishing pad.

After the substrate has been polished, it is typically cleaned, e.g., by a brush scrubber or megasonic cleaner, to remove excess slurry, polishing chemistry and other debris from the polishing process. After cleaning, the substrate is dried, e.g., by a spin-rinse drier, for return to the clean room. In some systems, e.g., systems that use the Marangoni effect, the cleaning and drying functions can be combined. Unfortunately, even after cleaning and drying, particles and other defects may remain on the substrate surface.

The chemical mechanical polishing and cleaning devices can be constructed as an integrated system with a single front-end automation interface between the clean room and the polishing and cleaning systems. An example of such an integrated system is the Mirra Mesa™ chemical mechanical polishing system from Applied Materials, Inc. of Santa Clara, Calif. Such an integrated system can include multiple ports to receive multiple cassettes at the interface with the clean room. Unfortunately, transport of the substrates between the cassettes and the polisher and cleaner can occasionally become backlogged, leading to a decrease in throughput.

SUMMARY

In one aspect, the invention is directed to a substrate processing system. The system has a factory interface module, a chemical mechanical polisher, and a substrate transfer system. The factory interface module includes a chamber, a plurality of cassette supports to support a plurality of cassettes outside the chamber, a plurality of ports for the transfer of substrates between the cassettes and the chamber, and a storage station located in the chamber to hold a plurality of substrates. The substrate transfer system transports a substrate through the chamber between the cassettes, the storage station and the polisher.

Implementations of the invention may include one or more of the following features. The storage station may hold the substrates in a substantially horizontal position. The storage station may includes a plurality of opposing slots to secure the edges of the substrates. The storage station may hold a pad break-in wafer or a monitor wafer. A controller may cause the substrate transfer system to transport the break-in wafer to the chemical mechanical polisher and to cause the polisher to break in a polishing pad with the pad break-in wafer. The pad break-in wafer may be a quartz wafer. They system may include a cleaner and/or a defect monitor. The defect monitor may have a port coupled to the factory interface module. A controller may cause the substrate transfer system to transport the monitor wafer to the polisher, cause the polisher to polish the monitor wafer, transport the polished monitor wafer to the cleaner, and cause the substrate transfer system to transfer the monitor wafer from the cleaner to the defect monitor. An input station may hold at least one substrate for loading into one of the chemical mechanical polisher and cleaner. The substrate transfer system may include a first robot to transport a substrate between the cassettes, the storage station and the input station, and a second robot to transport the substrate between the input station and the chemical mechanical polisher.

In another aspect, the invention is directed to a substrate processing system that has a factory interface module, a chemical mechanical polisher, a cleaner, a defect monitor, and a substrate transfer system. The factory interface module has a plurality of ports to receive a substrate from one of a plurality of cassettes in a clean room. The defect monitor detects defects on the substrate following polishing and cleaning at the polisher and cleaner. The substrate transfer system transports the substrate between the cassettes, the polisher, the cleaner, and the defect monitor. The factory interface module, polisher, cleaner, and defect monitor are disposed to form an integrated system.

Implementations of the invention may include one or more of the following features. The defect monitor may have a port coupled to the factory interface module. The defect monitor may measure a plurality of defect parameters, such as a number and size distribution of particles or scratches. A controller may receive a plurality of defect parameters from the defect monitor. The controller may be configured to determine whether one or more defect parameters meet a first criteria and to stop transferring substrates into the polisher if the first criteria is met. The controller may be configured to determine whether one or more defect parameters meet a second criteria, and to increase the number of substrates sent to the defect monitor if the second criteria is met. The factory interface module may include a storage station to hold a plurality of substrates, e.g., at least one monitor wafer. A controller may cause the substrate transfer system to transport the monitor wafer to the polisher, cause the polisher to polish the monitor wafer, transfer the polished monitor wafer to the cleaner, and cause the substrate transfer system to transport the monitor wafer from the cleaner to the defect monitor if the first criteria is met. An input station may hold at least one substrate for loading into one of the chemical mechanical polisher and cleaner, and the substrate transfer system may include a first robot to transport the substrate between the cassettes, the defect monitor and the input station, and a second robot to transport the substrate between the input station and the chemical mechanical polisher.

In another aspect, the invention is directed to a method of processing a substrate. In the method a first substrate is transferred from a storage station in a factory interface module to a polisher, a polishing pad at the polisher is broken in with the first substrate, and the first substrate is returned to the storage station. A second substrate is transferred from a cassette through the factory interface module to the polisher, and the second substrate is polished, cleaned and returned to the cassette.

In another aspect, the invention is directed to a method of processing a substrate. In the method, a substrate is transferred from a cassette through a factory interface module to a polisher, the substrate is polished at a chemical mechanical polisher and cleaned at a cleaner, and the substrate is transferred from the cleaner through the factory interface module to a defect monitor. A defect parameter is measured with the defect monitor, and the substrate is returned to the cassette.

In another aspect, the invention is directed to a method of processing substrates in which a first substrate is transferred from a cassette through a factory interface module to a polisher, polished at chemical mechanical polisher, and cleaned at a cleaner. A second substrate is transferred from a storage station in the factory interface module to the polisher, polished at the polisher, cleaned at the cleaner, and transferred from the cleaner through the factory interface module to a defect monitor. A defect parameter of the second substrate is measured with the defect monitor, and a polishing parameter is modified based on the defect parameter.

Implementations of the invention may include one or more of the following features. Modifying the polishing parameter may include halting polishing of substrates from the cassette if the measured defect parameter is outside an acceptable range. The first substrate may be returned to the cassette, and the second substrate may be returned to the storage station. The first substrate may be a device wafer and the second substrate may be a monitor wafer. The first substrate may be transferred from the cleaner through the factory interface module to the defect monitor, and a defect parameter of the first substrate may be measured with the defect monitor. A third substrate may be transferred from the cassette through the factory interface module to a polisher, polished at the chemical mechanical polisher, and cleaned at the cleaner.

In another aspect, the invention is directed to a method of processing substrates in which a device substrate is transferred from a cassette through a factory interface module to a polisher, polished at a chemical mechanical polisher, cleaned at a cleaner, and transferred from the cleaner through the factory interface module to a defect monitor. A first defect parameter of the device is measured with the defect monitor. A monitor substrate is transferred from a storage station in the factory interface module to the polisher, polished at the polisher, cleaned at the cleaner, and transferred from the cleaner through the factory interface module to the defect monitor. A second defect parameter of the monitor substrate is measured with the defect monitor, and the first defect parameter is compared to the second defect parameter.

Potential advantages of the invention may include zero or more of the following. Particles and other defects on the wafer can be measured in-line by the polishing system, without significantly increasing the footprint of the system. Substrates can be stored in the factory automation interface unit, also without significantly increasing the footprint of the system. The stored wafers give the system more flexibility in scheduling wafer transport operations, thereby permitting throughput to be increased.

The details of one or more embodiments of the invention are set forth in the accompanying drawings and the description below. Other features, objects, and advantages of the invention will be apparent from the description and drawings, and from the claims.

DESCRIPTION OF DRAWINGS

FIG. 1 is a schematic top view of a substrate processing system according to the present invention.

FIG. 2 is a schematic side view of the substrate processing system of FIG. 1.

FIG. 3 is a schematic of a factory interface robot.

FIG. 4 is a schematic side view of a substrate holding station in the factory interface unit.

Like reference symbols in the various drawings indicate like elements.

DETAILED DESCRIPTION

A substrate processing system 20 is depicted in FIGS. 1 and 2. The substrate processing system 20 includes a chemical mechanical polisher 22, a wet robot 24, a cleaner 26, an in-situ particle or defect monitor 30, and a factory interface module 28. Substrates 10, e.g., silicon wafers, are transported to the substrate processing system 20 in cassettes 12, and are extracted from the cassettes 12 by the factory interface module 28 for transport to the polisher 22 and the cleaner 26. The operations of the substrate processing system 20 are coordinated by controller 32, such as one or more programmable digital computers executing distributed control software.

The factory interface module 28 is substantially rectangular in shape and includes an outer wall 100, an inner wall 102, a first side wall 104, and a second side wall 106. The outer wall 100 can be aligned with a cleanroom wall. A plurality (e.g., four) cassette support plates 110 project from the outer wall 100 into the cleanroom to accept the wafer cassettes 12, and a plurality of cassette ports 112 are formed in the outer wall 100 to permit wafer transport from the cassettes 12 into the factory interface module 28. The inner wall 104 mates against a front wall 170 of the cleaner 26 and shares an entry port 120 and an exit port 122 with the cleaner front wall 170. One of the side walls 104 or 106 (side wall 106 in the implementation shown in FIG. 1) mates with a wall 160 of the particle monitor system 30 and shares an access port 124 with the particle monitor system 30. The inner wall 102 and the cleaner front wall 170 may be combined into one structure, and there may be additional ports from the factory interface module 28 to the cleaner 26. Similarly, the side wall 104 and the monitoring system wall 160 may be combined into one structure, and there may be additional ports from the factory interface module 28 to the particle monitoring system 30.

A factory interface robot 130, depicted in greater detail in FIG. 3, is housed within the factory interface module 28. As shown in FIG. 3, one implementation of the factory interface robot 130 has a robot base 132, a vertical shaft 134, an articulated arm 136, a rotary actuator 138, and a substrate gripper 140. The vertical shaft 134 is capable of extending and retracting the articulated arm vertically 136 as shown by arrows A. The articulated arm 136 is capable of rotary motion about a vertical axis as shown by arrows B and of extending and retracting horizontally as shown by arrows C. The rotary actuator 138 is capable of rotating the substrate gripper 140 about a horizontal axis as shown by arrows D. The factory interface robot 130 thus provides a wide range of motion to manipulate the substrate held by the gripper 140. The gripper 140 can be a vacuum chuck, an electrostatic chuck, an edge clamp, or similar wafer gripping mechanism. The factory interface robot can also include an optical detector to sense whether a substrate is being held by the gripper 140.

Returning to FIGS. 1 and 2, the robot base 132 is positioned on a linear slide 142 that extends parallel to the inner and outer walls 102, 100. The factory interface robot 130 can travel along the railway 142 to access the entry port 120, the exit port 122, and the cassette ports 112 (FIG. 1 illustrates two positions along the slide 142 for the factory interface robot 130).

As shown in FIGS. 2 and 4, the factory interface module 28 includes a temporary storage station 150. The storage station 150 includes two side walls 152 with a plurality of opposing horizontal slots 154 that define a plurality of nests 156. Substrates 10 are held by the slots 154 in the nests 156 in a substantially horizontal position. The slots 154 are open at both ends to permit the factory interface robot 130 to retrieve and return substrates from either side of the storage station 150. Alternatively, the slots 154 could be open only at the end closer to the particle monitor 30. Although the temporary storage station is illustrated with six slots (to hold six substrates), there could be a larger or smaller number of slots. In addition, different support structures, such as support rings or support pins, could be used to support the substrates in the storage station 150. Optionally, each nest 156 may be equipped with a sensor (not shown) that detects whether a substrate is being held in the nest. For example, the storage station can include an optical detector coupled to the nests by fiber optic cables.

Returning to FIGS. 1 and 2, the storage station 150 may be positioned near the center of the factory interface module 28 above the cassette ports 112. From this location, the factory interface robot 130 is able to pick and place substrates into the nests 156 in the storage station 150. Specifically, if the factory interface robot 130 is positioned near the exit port 122, it can transport substrates between the storage station 150 and the particle monitoring system 30. Similarly, if the factory interface robot 130 is positioned near the entry port 120, it can transport substrates between the storage station 150 and the staging section 176. In addition, since the storage station 150 is positioned above the cassette ports 112a–112d, its presence does not interfere with the transport of substrates into and out of the cassettes 12.

The in-situ defect monitoring system 30 is a rectangularly shaped cabinet with an inner wall 160, an outer wall 162, and two side walls 164. The interior of the cabinet holds an in-situ particle and scratch monitor 166. The particle and scratch monitor 166 can be a conventional particle monitor, or an "IPM" mointor available from Applied Materials of Santa Clara, Calif., that can scan the surface of a substrate for defects, including particulates and scratches. Substrates are typically held by the defect monitor 166 in a generally horizontal position, e.g., with a vacuum chuck or an edge gripper. Substrates are transported between the particle monitoring system 30 and the factory interface module 28 by the factory interface robot 130.

Preferably, the defect monitor 30 can determine the size of the particles and scratches so as to provide several defect level measurements, including the total defect count, the distribution of particles across different sizes, the number and PSL equivalent size for small scratches, and the number and PSL equivalent size for large scratches. The controller stores a set of rules for determining the operation of the processing system. The sets of rules may be stored in a file associated with an individual cassette file, so that substrates from different cassettes can have different handling rules. Each rule can be expressed as a parameter calculated from one or more defect level measurements, a threshold, and a resulting system operation if the parameter exceeds the threshold. In addition, rules that would produce the same system operation can be combined with Boolean logic to provide a multi-variable analysis. Possible system operations include triggering a "safety" mode in which every substrate (or at least a greater percentage of substrates) are monitored until the defect parameters return to acceptable levels, a "clearing" mode in which polishing and cleaning of substrates presently in the system is completed but no new substrates are polished, a "testing" mode in which the "clearing" mode is followed by polishing and analysis of several monitor substrates in a defect source determination procedure, and a "halt" mode in which the polishing system immediately halts all operations. In general, defect levels below a lower threshold are considered acceptable, defect levels between the lower threshold and an upper threshold require more intensive multi-variable analysis or more intensive monitoring, and defect levels above an upper threshold can require a system shutdown for operator inspection.

The particle monitor 30 may include multiple measuring heads. For example, the particle monitor 30 may include one measuring head for patterned device substrates, and another measuring head for monitoring substrates on which an unpatterned blanket has been deposited.

It may be possible to characterize the source of the defects using the information from the particle monitor 30, and use this information to control the polishing system 20. For example, the presence of particles of less than 0.2 microns typically corresponds to a scratch problem at one of the platens. The presence of larger particles typically corresponds to a problem in the cleaner 26.

The cleaner 26 is also a generally rectangular shaped cabinet with a front wall 170, a back wall 172, and two side walls 174. The interior of the cleaner 26 is divided into an input or staging section 176 and a cleaning section 178. The staging section 176 includes a substrate-pass through support 180 and an indexable buffer 182, each of which can hold one or more substrates in a vertical orientation. The cleaner also includes a walking beam 184 which can hold a substrate in a vertical orientation.

The wet robot 24 is similar to the factory interface robot 130, and provides a wide range of motion to manipulate the substrate when transporting it between the staging section 176 and the polisher 22.

The polisher 22 can be a Mirra® chemical mechanical polisher manufactured by Applied Materials, Inc. of Santa Clara, Calif. A description of a similar polisher may be found in U.S. Pat. No. 5,738,574, the entire disclosure of which is incorporated herein by reference. The polisher 22 includes a series of polishing stations 50 and a transfer station 52. The transfer station 52 serves multiple functions, including receiving individual substrates 10 from the wet robot 24, washing the substrates and loading the substrates into carrier heads. Typically, each polishing station includes a rotatable platen 54 that supports a polishing pad 56, e.g., a standard or a fixed-abrasive or polishing pad. A rotatable carousel 60 that holds four carrier heads 62 is supported above the polishing stations 50. The carousel 60 rotates to carry the substrates between the polishing stations 50 and the transfer station 52.

In normal polishing operation, an unpolished substrate is retrieved by the factory interface robot 130 from one of the cassettes 112. The factory interface robot 130 "picks" the substrate, e.g., by vacuum suction, and transports it through the entry port 120 to the staging section 176. There, the substrate is placed in either the pass-through support 180 or the indexible buffer 182. The wet robot 24 then extracts the substrate 10 from the staging section 176 and places the substrate 10 into the transfer station 52 of the polisher 22. From the transfer station, the substrate is carried to one or more polishing stations 50 to undergo chemical mechanical polishing. After polishing, the wet robot 24 transports the substrate 10 from the transfer station 52 of the polisher 22 to the walking beam 184 in the cleaner 26. The walking beam 184 transports the substrate through the cleaner section 178 of the cleaner 26. While the substrate 10 is transported through the cleaner section 178, slurry and other contaminants that have accumulated on substrate surface during polishing are removed. The factory interface robot 130 removes the substrate 10 from the cleaner 26 through the exit port 122, and inserts the substrate into the particle monitor 30. Finally, the factory interface robot 130 extracts the substrate from the particle monitor 30 and returns the substrate 10 to one of the cassettes 112.

By disposing the factory interface unit, polisher, cleaner and particle monitoring system in a single integrated system, particle monitoring of individual substrates can be performed as part of the standard set of processing steps performed at the processing system. In addition, the substrate defects can be measured without the substrate having to be transported in the cassette to a remote particle monitoring system. This permits the processing system to react immediately if the defect rate increases. In a conventional system in which the cassette is transported to a remote particle monitoring system, all of the substrates in the cassette would have been polished and cleaned. Thus, all the substrates in the cassette would be exposed to the defect source. Moreover, any substrates polished and cleaned while the cassette is being transported to the particle monitor would be exposed to the defect source. In contrast, in the present processing system, polishing or cleaning operations can be haloted as soon as the defects are detected, and before all of the substrates in a cassette have been processed, thereby improving yield.

Of course, not all substrates need be sent to the particle monitor 30; the control software of controller 32 can be configured so that only a certain fraction of the substrates are sent to the particle monitor 30. The remaining substrates can be routed from the cleaner 26 directly to the cassette 12 from which the substrate originated. In addition, some substrates can be routed to the particle monitor 30 prior to polishing in order to measure pre-polishing defect rates.

As discussed above, if defect levels rise above a predetermined threshold, the controller can initiate a defect source determination procedure. Specifically, three monitor substrates, e.g., 3 micron TEOS wafers of monitor quality, can be stored in the storage station 150. The defects on the monitor substrates should be measured when they are initially loaded into the processing system 10, and this defect information should be stored in the controller 32. When the defect source determination procedure is run, these three substrates are loaded into the polisher (one at each polishing station), polished using a batch polishing procedure, cleaned, and then measured at the particle monitor. By comparing the defects pre and post polishing for the different substrates, the operator can pinpoint which polishing station is the source of the defects. Since the monitor substrates are held in the storage station 150, they are immediately available for the defect source determination procedure, thereby reducing system down-time and improving throughput.

The processing system controller 32 can also be configured to periodically process the monitor substrates held in the storage station 150 during normal polishing operations. For example, for every n patterned device wafers that have been processed, one monitor substrate can be run through the polisher, cleaner and particle monitor. By interspersing the defect measurements on blanket wafers with the polishing of device wafers, the operator can ensure that defects and scratches are under control. In addition, if device wafers are run through the particle monitor after polishing and cleaning, the processing system can compare the rate of defects and scratches on the monitor substrates to the rate of defects and scratches on the device substrates. Since the storage station 150 located in the factory interface module 28 has monitor substrates on hand, it is not necessary to transport substrates from outside the system or occupy a cassette port. Thus, the throughput of the processing system when measuring defects on monitoring substrates is improved, without requiring additional floor space or sacrificing substrate transport flexibility at the factory interface module 28.

Another source of down-time for the processing system 20 is polishing pad break-in. For example, after a new polishing pad is installed, several minutes of oxide polishing are needed for the polishing rates to stabilize. Conventionally, a cassette with dummy oxide wafers would be carried to the factory interface unit 28, and these dummy wafers would be used to break in the new polishing pad. However, if several dummy wafers are stored in the storage station 150, the time required to locate and transport a cassette of dummy wafers is eliminated, thus reducing down-time and improving throughput of the substrate processing system 20. The dummy wafers may be formed of quartz.

A number of embodiments of the invention have been described. Nevertheless, it will be understood that various modifications may be made without departing from the spirit and scope of the invention. Accordingly, other embodiments are within the scope of the following claims.

What is claimed is:

1. A method of processing a substrate, comprising:
   transferring a first substrate from a storage station in a factory interface module to a polisher;
   breaking in a polishing pad at the polisher with the first substrate;
   returning the first substrate to the storage station;
   transferring a second substrate from a cassette through the factory interface module to the polisher;
   polishing the second substrate;
   cleaning the second substrate; and
   returning the second substrate to the cassette.

2. A method of processing substrates, comprising:
   transferring a first substrate from a cassette through a factory interface module to a polisher;
   polishing the first substrate at the polisher;
   cleaning the first substrate at a cleaner;

transferring a second substrate from a storage station in the factory interface module to the polisher;

polishing the second substrate at the polisher;

cleaning the second substrate at the cleaner;

transferring the second substrate from the cleaner through the factory interface module to a defect monitor;

measuring a defect parameter of the second substrate with the defect monitor;

modifying a polishing parameter of the polisher based on the defect parameter.

3. The method of claim 2, wherein modifying the polishing parameter includes halting polishing if the measured defect parameter is outside an acceptable range.

4. The method of claim 2, further comprising returning the first substrate to the cassette.

5. The method of claim 2, further comprising returning the second substrate to the storage station.

6. The method of claim 2, wherein said first substrate is a device wafer and the second substrate is a monitor wafer.

7. The method of claim 2, further comprising transferring the first substrate from the cleaner through the factory interface module to the defect monitor and measuring a defect parameter of the first substrate with the defect monitor.

8. The method of claim 2, further comprising transferring a third substrate from the cassette through the factory interface module to the polisher, polishing the third substrate at the polisher, and cleaning the third substrate at the cleaner.

9. A method of processing substrates, comprising:

transferring a device substrate from a cassette through a factory interface module to a polisher;

polishing the device substrate at the polisher;

cleaning the device substrate at a cleaner;

transferring the device substrate from the cleaner through the factory interface module to a defect monitor;

measuring a first defect parameter of the device with the defect monitor;

transferring a monitor substrate from a storage station in the factory interface module to the polisher;

polishing the monitor substrate at the polisher;

cleaning transferring the monitor substrate from the cleaner through the factory interface module to the defect monitor;

measuring a second defect parameter of the monitor substrate with the defect monitor; and comparing the first defect parameter to the second defect parameter.

* * * * *